(12) United States Patent
Bergmann et al.

(10) Patent No.: US 8,143,361 B2
(45) Date of Patent: Mar. 27, 2012

(54) EVM IN SOLAR MODULES

(75) Inventors: Gerd Bergmann, Köln (DE); Gerd Deimel, Leverkusen (DE); Michael Herrmann, Köln (DE); Arndt Kremers, Würselen (DE); Martin Mezger, Burscheid (DE); Harry Zumaque, Köln (DE)

(73) Assignee: LANXESS Deutschland GmbH, Leverkusen, DE (US)

( * ) Notice: Subject to any disclaimer, the term of this patent is extended or adjusted under 35 U.S.C. 154(b) by 681 days.

(21) Appl. No.: 12/199,845

(22) Filed: Aug. 28, 2008

(65) Prior Publication Data

US 2009/0101196 A1    Apr. 23, 2009

(30) Foreign Application Priority Data

Aug. 29, 2007 (DE) .................. 10 2007 041 055

(51) Int. Cl.
*C08F 218/08* (2006.01)
*H01L 31/042* (2006.01)

(52) U.S. Cl. ........ 526/330; 526/331; 136/251; 136/244; 136/252

(58) Field of Classification Search .................. 526/330, 526/331; 136/251, 244, 252
See application file for complete search history.

(56) References Cited

U.S. PATENT DOCUMENTS

| | | | | |
|---|---|---|---|---|
| 4,832,755 | A | * | 5/1989 | Barton et al. .................. 136/251 |
| 4,937,303 | A | * | 6/1990 | Wolf et al. ..................... 526/212 |
| 5,135,988 | A | | 8/1992 | Meurer et al. ................. 525/302 |
| 6,093,757 | A | | 7/2000 | Pern ................................ 524/99 |
| 6,660,556 | B2 | | 12/2003 | Hashimoto et al. ............. 438/66 |
| 2001/0045229 | A1 | * | 11/2001 | Komori et al. ................. 136/251 |

FOREIGN PATENT DOCUMENTS

| | | |
|---|---|---|
| EP | 0 510 478 | 10/1992 |
| JP | 2003-051605 * | 2/2003 |
| JP | 20030049004 | 2/2003 |
| JP | 20030051605 | 2/2003 |

* cited by examiner

*Primary Examiner* — Ling-Siu Choi
(74) *Attorney, Agent, or Firm* — Michael A. Miller

(57) ABSTRACT

The present invention relates to a solar module containing at least one layer made up of at least one α-olefin-vinyl acetate copolymer which has a vinyl acetate content of ≧40% by weight, based on the total weight of the α-olefin-vinyl acetate copolymer, and has been prepared by a solution polymerization process at a pressure of from 100 to 700 bar, the use of the α-olefin-vinyl acetate copolymer mentioned in solar modules, the use of the solar module of the invention for stationary or mobile power generation and also a solar power plant containing at least one solar module according to the invention.

18 Claims, 1 Drawing Sheet

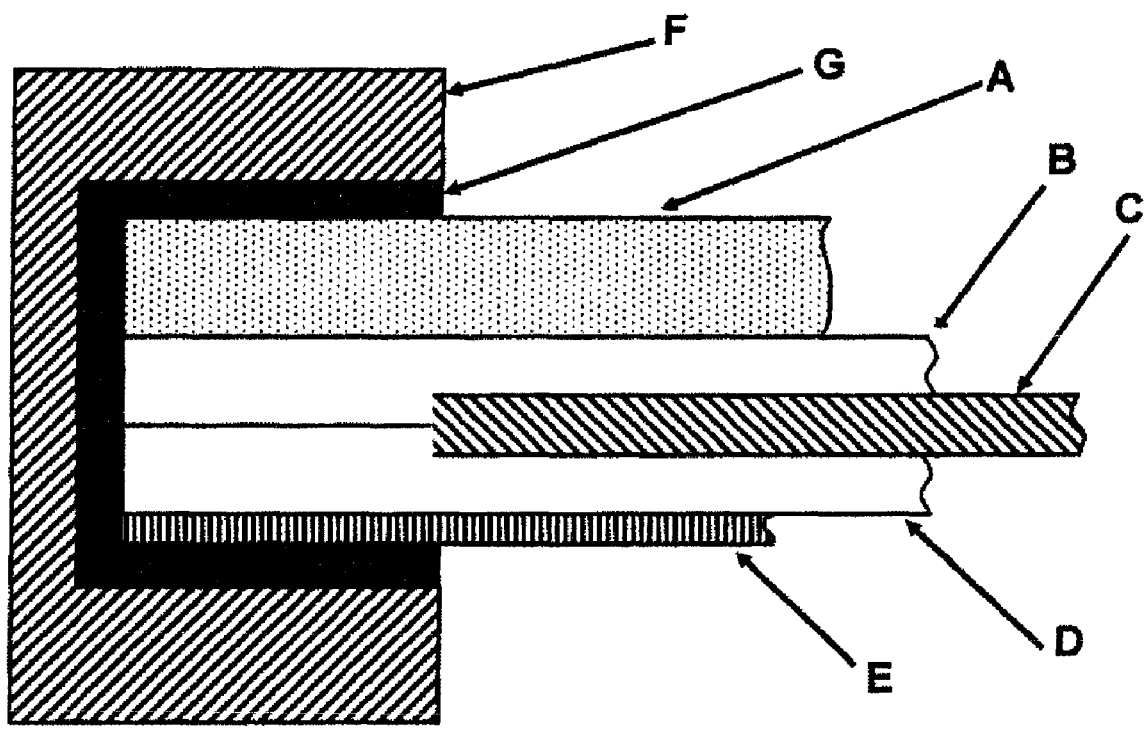

EVM IN SOLAR MODULES

FIELD OF THE INVENTION

The present invention relates to a solar module containing at least one layer made up of at least one α-olefin-vinyl acetate copolymer which has a vinyl acetate content of ≧40% by weight, based on the total weight of the α-olefin-vinyl acetate copolymer, and has been prepared by a solution polymerization process at a pressure of from 100 to 700 bar, the use of the α-olefin-vinyl acetate copolymer mentioned in solar modules, the use of the solar module of the invention for stationary or mobile power generation and also a solar power plant containing at least one solar module according to the invention.

BACKGROUND OF THE INVENTION

Solar modules which convert the light of the sun directly into electric energy enable natural resources to be utilized for power generation.

The most important constituent of solar modules are solar cells by means of which the direct conversion of sunlight into electric energy is effected. The solar modules are frequently used outdoors, e.g. on buildings. The solar cells present in the solar modules therefore have to be protected against environmental influences. Since moisture penetrating into the solar cells can greatly shorten the life of the solar cells and thus of the solar module as a result of corrosion, durable encapsulation (embedding) of the solar cells is of particular importance. The material used for encapsulation of the solar cells has to be transparent to sunlight and at the same time make it possible for the solar modules to be produced inexpensively. Material which has frequently been used in the prior art for embedding the solar cells are ethylene-vinyl acetate copolymers.

For example, WO-A-97/22637 relates to an essentially transparent and colourless embedding material which is free of absorber components for ultraviolet light and is made up of a polymer component and a crosslinking reagent. According to WO-A-97/22637 ethylene-vinyl acetate copolymer is preferably used as polymer component. In Example 1 in WO-A-97/22637, a random ethylene-vinyl acetate copolymer made up of 67% by weight of ethylene and 33% by weight of vinyl acetate is used.

EP 1 164 167 A1 discloses encapsulation materials comprising an ethylene-vinyl acetate copolymer (EVA), a crosslinker and a polymerization inhibitor. According to EP 1 164 167 A1, the EVA has a vinyl acetate content of from 5 to 50% by weight. At contents above 50% by weight, the mechanical properties of the EVA deteriorate and it becomes difficult to produce EVA films, according to EP 1 164 167 A1. EP 1 164 167 A1 gives no information about the method of producing the EVA used in EP 1 164 167 A1. An EVA copolymer containing 26% by weight of vinyl acetate is used in Examples 1 and 2 in EP 1 164 167 A1.

EP 1 184 912 A1 likewise relates to an embedding material for solar cells which is made up of an ethylene-vinyl acetate copolymer (EVA). According to EP 1 184 912 A1, the vinyl acetate content of the EVA copolymer is from 10 to 40% by weight. Contents of more than 40% by weight of vinyl acetate are unfavourable according to EP 1 184 912 A1 since EVA copolymers having contents of more than 40% by weight of vinyl acetate flow easily and thus make the embedding process for the solar cells more difficult. Furthermore, according to EP 1 184 912 A1, EVA copolymers having a vinyl acetate content of more than 40% by weight are sticky so that the EVA film used for embedding is difficult to handle. The EVA films which are preferably used according to EP 1 184 912 A1 are crosslinked.

JP-A 2003-051605 discloses a film for a solar module which is made up of an EVA copolymer which is mixed with an organic peroxide, a silane coupling reagent and stabilizers. The vinyl acetate content of the EVA copolymer according to JP-A 2003-051605 is 27% or more. In the examples, an EVA copolymer having a vinyl acetate content of 28% is used.

JP-A 2003-049004 relates to a flexible film which is suitable for the embedding of solar cells without crosslinking. The flexible film is preferably made up of an ethylene polymer or an ethylene-α-olefin copolymer or an ethylene-acrylate copolymer. According to the description in JP-A 2003-049004, alternative systems to EVA systems should be made available.

Proceeding from the prior art, it is an object of the present invention to provide solar modules or embedding materials for solar cells which display a long life, excellent UV resistance and simplified fixing of the solar cells.

This object is achieved by a solar module containing at least one layer made up of at least one α-olefin-vinyl acetate copolymer.

SUMMARY OF THE INVENTION

The solar module of the invention is then characterized in that the α-olefin-vinyl acetate copolymer has a vinyl acetate content of ≧40% by weight, based on the total weight of the α-olefin-vinyl acetate copolymer, and has been prepared by a solution polymerization process at a pressure of from 100 to 700 bar.

A BRIEF DESCRIPTION OF THE DRAWINGS

FIG. 1 illustrates a solar module according to the instant Specification.

DETAILED DESCRIPTION OF THE INVENTION

It has surprisingly been found that the α-olefin-vinyl acetate copolymers used according to the invention, which have been prepared by a solution polymerization process at a pressure of from 100 to 700 bar, are, despite the high vinyl acetate content described as disadvantageous in the prior art, e.g. in EP 1 164 167 A1 and EP 1 184 912 A1, highly suitable for use in solar modules.

The α-olefin-vinyl acetate copolymers used according to the invention have excellent UV resistance and make simplified, compared to the ethylene-vinyl acetate copolymers used in the prior art, fixing of the solar cells possible, as a result of which time and energy can be saved in the lamination process in the production of the solar modules of the invention.

The α-olefin-vinyl acetate copolymers used according to the invention have high vinyl acetate contents of ≧40% by weight, based on the total weight of the α-olefin-vinyl acetate copolymer, preferably have vinyl acetate contents of ≧50% by weight, particularly preferably ≧60% by weight, in each case based on the total weight of the α-olefin-vinyl acetate copolymers. The vinyl acetate content of the α-olefin-vinyl acetate copolymers used according to the invention is usually from ≧40% by weight to 98% by weight, preferably from ≧50% by weight to 98% by weight, particularly preferably from ≧60% by weight to 98% by weight, and the α-olefin content is usually from 2% by weight to ≦60% by weight, preferably from 2% by weight to ≦50% by weight, particularly preferably from 2% by weight to ≦40% by weight, with the total amount of vinyl acetate and α-olefin being 100% by weight.

In a further embodiment, the α-olefin-vinyl acetate copolymer used according to the invention can comprise not only the monomer units based on the α-olefin and vinyl acetate but also one or more further comonomer units (e.g. terpolymers), e.g. comonomer units based on vinyl esters and/or (meth) acrylates. The further comonomer units are, if further comonomer units are present at all in the α-olefin-vinyl acetate copolymer, present in a proportion of up to 10% by weight, based on the total weight of the α-olefin-vinyl acetate copolymer, with the proportion of the monomer units based on the α-olefin being reduced correspondingly. Thus, for example, it is possible to use α-olefin-vinyl acetate copolymers made up of from ≧40% by weight to 98% by weight of vinyl acetate, from 2% by weight to ≦60% by weight of α-olefin and from 0 to 10% by weight of at least one further comonomer, with the total amount of vinyl acetate, α-olefin and the further comonomer being 100% by weight.

As α-olefins, it is possible to use all known α-olefins in the α-olefin-vinyl acetate copolymers used according to the invention. The α-olefin is preferably selected from among ethene, propene, butene, in particular n-butene and i-butene, pentene, hexene, in particular 1-hexene, heptene and octene, in particular 1-octene. It is also possible to use higher homologues of the α-olefins mentioned as α-olefins in the α-olefin-vinyl acetate copolymers used according to the invention. Furthermore, the α-olefins can bear substituents, in particular $C_1$-$C_5$-alkyl radicals. However the α-olefins preferably do not bear any further substituents. It is also possible to use mixtures of two or more different α-olefins in the α-olefin-vinyl acetate copolymers used according to the invention. However, it is preferred that mixtures of various α-olefins are not used. Preferred α-olefins are ethene and propene, with ethene being particularly preferably used as α-olefin in the α-olefin-vinyl acetate copolymers used according to the invention. Thus, the α-olefin-vinyl acetate copolymer used in the solar module of the invention is preferably an ethylene-vinyl acetate copolymer.

Particularly preferably ethylene-vinyl acetate copolymers have a vinyl acetate content of from ≧40% by weight to 98% by weight, preferably from ≧50% by weight to 98% by weight, particularly preferably from ≧60% by weight to 98% by weight, and an ethylene content of from 2% by weight to ≦60% by weight, preferably from 2% by weight to ≦50% by weight, particularly preferably from 2% by weight to ≦40% by weight, with the total amount of vinyl acetate and ethylene being 100% by weight.

The α-olefin-vinyl acetate copolymer, preferably ethylene-vinyl acetate copolymer, used according to the invention is prepared by a solution polymerization process at a pressure of from 100 to 700 bar, preferably at a pressure of from 100 to 400 bar. The solution polymerization process is preferably carried out at temperatures of from 50 to 150° C., generally using free-radical initiators.

The ethylene-vinyl acetate copolymers having high vinyl acetate contents which are preferably used according to the invention are usually referred to as EVM copolymers, where the "M" in the abbreviation indicates the saturated backbone of the methylene main chain of the EVM.

Suitable processes for preparing the α-olefin-vinyl acetate copolymers used according to the invention are mentioned, for example, in EP-A 0 341 499, EP-A 0 510 478 and DE-A 38 25 450.

The α-olefin-vinyl acetate copolymers which have a high vinyl acetate content and are prepared by the solution polymerization process at a pressure of from 100 to 700 bar, which are used according to the invention, have, in particular, low degrees of branching and thus low viscosities. Furthermore, the α-olefin-vinyl acetate copolymers used according to the invention have a random uniform distribution of their building blocks (α-olefin and vinyl acetate).

The α-olefin-vinyl acetate copolymers, preferably ethylene-vinyl acetate copolymers, used according to the invention generally have MFI values (g/10 min) measured in accordance with ISO 1133 at 190° C. under a load of 21.1 N of from 1 to 40, preferably from 1 to 10, particularly preferably from 2 to 6.

The Mooney viscosities ML 1+4 at 100° C., measured in accordance with DIN 53 523, are generally from 3 to 50 Mooney units, preferably from 4 to 35 Mooney units.

The number average molecular weight, determined by means of GPC, is generally from 5000 g/mol to 200 000 g/mol, preferably from 10 000 g/mol to 100 000 g/mol.

Particular preference is given to using ethylene-vinyl acetate copolymers which are obtainable, for example, under the trade names Levapren® or Levamelt® from Lanxess AG in the solar module of the invention.

α-Olefin copolymers which are particularly preferably used are the ethylene-vinyl acetate copolymers Levamelt® 600, Levamelt® 700, Levamelt® 800 and Levamelt® 900 containing 60±1.5% by weight of vinyl acetate, 70±1.5% by weight of vinyl acetate, 80±2% by weight of vinyl acetate and 90±2% by weight of vinyl acetate, respectively.

When the α-olefin-vinyl acetate copolymers used according to the invention are employed, solar modules which have a longer operating life than solar modules containing ethylene-vinyl acetate copolymers which have lower vinyl acetate contents and, owing to the different method of preparation, other product properties are obtained.

The α-olefin-vinyl acetate copolymers used according to the invention can be crosslinked or uncrosslinked. A particular advantage of the α-olefin-vinyl acetate copolymers used according to the invention is that, in a preferred embodiment of the present invention, crosslinking of the α-olefin-vinyl acetate copolymers is dispensed with when they are used in the solar module of the invention. In a preferred embodiment, the present invention thus provides a solar module according to the invention in which the α-olefin-vinyl acetate copolymers used according to the invention are present in uncrosslinked form.

This is a great advantage over the EVA copolymers which are usually used in solar modules and have lower vinyl acetate contents and have to be crosslinked by means of peroxides.

In particular, mention may be made of the following advantages which are obtained when using the preferably uncrosslinked α-olefin-vinyl acetate copolymers used according to the invention, especially in the production of the solar modules:

Energetic: Since the step of peroxidic crosslinking is dispensed with in a preferred embodiment, it is in principle possible to carry out lamination at lower temperatures since it is not necessary to attain an activation temperature in order to start the reaction;

Cycle time in the production of the solar modules:
This is shorter since the abovementioned crosslinking step is dispensed with. This means a higher throughput.

Lower maintenance requirement:
The machines in which the crosslinking step is carried out are not exposed to the aggressive dissociation products. The machine and the moveable components therein have a longer life and require less maintenance. This again means a saving in both material costs and downtime costs.

A further advantage of the use according to the invention of the α-olefin-vinyl acetate copolymers mentioned is that neither bonding agents nor ageing inhibitors are required when the α-olefin-vinyl acetate copolymers mentioned are used in solar modules, since the intrinsic stickiness of the material used according to the invention is sufficient for the use and the higher proportion of VA in the EVM compared to EVAs used in the prior art gives inherent protection against UV.

The present invention therefore further provides a solar module according to the invention containing at least one layer made up of at least one of the abovementioned α-olefin-vinyl acetate copolymers used according to the invention, wherein the layer contains no ageing inhibitors, in particular no UV stabilizers, and/or no bonding agents, in particular no silane bonding agents, particularly preferably neither ageing inhibitors nor bonding agents.

The key aspect of the invention is the use of the abovementioned α-olefin-vinyl acetate copolymers in solar modules. The solar module according to the invention can be any solar module known to those skilled in the art as long as this contains at least one layer of at least one α-olefin-vinyl acetate copolymer of the type used according to the invention. Suitable solar modules are mentioned below.

In a preferred embodiment, the solar module of the invention is made up of the following layers:
i) a glass substrate A having a front side and a rear side, with the front side being the side facing the sun in the finished solar module;
ii) a transparent polymer layer B applied to the rear side of the glass substrate;
iii) one or more solar cells C applied to the polymer layer B;
iv) a further transparent polymer layer D applied on top of the solar cells;
v) a protective layer E;
where the solar cells C are embedded in the transparent polymer layers B and D and one of the transparent polymer layers B and/or D is made up of at least one α-olefin-vinyl acetate copolymer used according to the invention.

Suitable and preferred suitable α-olefin-vinyl acetate copolymers used according to the invention have been mentioned above.

The solar module of the invention preferably additionally has a connection socket and a connection terminal and also, if the solar module is a rigid solar module, a frame, preferably an aluminium profile frame.

Glass plates are suitable as glass substrate A, with preference being given to using a single-plate safety glass (SSG). All glass substrates known to those skilled in the art are suitable, with the term "glass substrate" also encompassing other transparent substrates such as polycarbonate.

Suitable transparent polymer layers B and D are α-olefin-vinyl acetate copolymers, in particular ethylene-vinyl acetate copolymers, with at least one polymer layer B or D, preferably both polymer layers B and D, being made up of the α-olefin-vinyl acetate copolymer used according to the invention, as has been defined above.

As solar cells C, it is possible to use all solar cells known to those skilled in the art. Suitable solar cells are silicon cells which may be thick-film cells (monocrystalline or polycrystalline cells) or thin-film cells (amorphous silicon or crystalline silicon); III-V semiconductor solar cells (Ga—As cells); II-VI semiconductor solar cells (CdTe cells); CIS cells (copper-indium diselenide or copper-indium disulphide) or CIGS cells (copper-indium-gallium diselenide); organic solar cells, dye cells (Grätzel cells) or semiconductor electrolyte cells (e.g. copper oxide/NaCl solution); with preference being given to using silicon cells. Here, it is possible to use all types of silicon cells known to those skilled in the art, e.g. monocrystalline cells, polycrystalline cells, amorphous cells, microcrystalline cells or tandem solar cells which are, for example, made up of a combination of polycrystalline and amorphous cells. Preference is given to using polycrystalline and amorphous cells.

Apart from thick-film cells, it is possible to use thin-film cells, concentrator cells, electrochemical dye solar cells, organic solar cells or fluorescence cells. Flexible solar cells can also be used. The α-olefin-vinyl acetate copolymers used according to the invention are, in contrast to EVA copolymers usually employed in solar cells, elastomers and therefore particularly suitable for use in flexible solar cells. The structures of the abovementioned solar cells are known to those skilled in the art.

Suitable methods of producing the solar cells C are known to those skilled in the art.

The solar module of the invention usually contains a plurality of solar cells which are, for example, electrically connected to one another by solder strips. The solar cells C are embedded in the transparent polymer layers B and D.

Furthermore, the solar module of the invention contains a protective layer E which is applied on top of the transparent polymer layer D. The protective layer E is generally a weathering-resistant protective layer which forms the rear side (rear side lamination) of the solar module. This is usually a polymer film, in particular a composite polymer film, for example made up of polyvinyl fluoride, e.g. Tedlar® from DuPont, or polyester.

The connection socket which is preferably additionally present in the solar module of the invention is, for example, a connection socket having a recovery diode or bypass diode. These recovery or bypass diodes are necessary for protecting the solar module in the event of no current being supplied by the solar module, for example as a result of shading or a defect.

In addition, the solar module preferably has a connection terminal which makes connection of the solar module to a solar power plant possible.

Finally, if the solar module is a rigid solar module it has, in a preferred embodiment, a frame, for example an aluminium profile frame, to increase the stability of the solar module.

The individual abovementioned elements of the solar module and preferred embodiments of these elements are known to those skilled in the art.

The solar module of the invention is produced by conventional methods known to those skilled in the art. In general, the appropriate, generally cleaned, glass substrate A is firstly provided and the transparent polymer layer B, which is preferably made up of the α-olefin-vinyl acetate copolymer used according to the invention, is applied to this. The transparent polymer layer B is usually cut to size before application to the glass substrate. The solar cells C are subsequently positioned on the transparent polymer layer B. They are generally joined to one another beforehand by means of solder strips to form individual strings. Transverse connectors which join the individual strings to one another and lead to the connection socket are then usually put in place and, if appropriate, soldered. Finally, the further transparent polymer layer D, which is preferably made up of the α-olefin-vinyl acetate copolymer used according to the invention and is generally cut to size before application, is applied. This is followed by application of the protective layer E.

After application of the individual layers, the solar module of the invention is laminated. Lamination is carried out by methods known to those skilled in the art, for example under subatmospheric pressure and at elevated temperature (for example from 100 to 200° C.). Lamination results in the solar cells being embedded in the transparent polymer layers B and D and joined firmly to the glass substrate A and the protective layer E. The connection socket is then generally installed and the module is provided with a frame.

The individual process steps for producing the solar module of the invention are carried out according to methods known to those skilled in the art.

The α-olefin-vinyl acetate copolymers used according to the invention can also be used in solar modules which have a structure different from the abovementioned preferred structure. Further types of solar modules in which the α-olefin-vinyl acetate copolymers used according to the invention can be employed are known to those skilled in the art. Examples are laminated glass-glass modules, glass-glass modules produced by the pourable resin technique, glass-glass modules produced by the composite safety film technology, thin-film modules behind glass or as flexible coating, for example, on copper strip, concentrator modules in which the sunlight is concentrated by means of optics onto smaller solar cells, and also fluorescence collectors.

Compared to ethylene-vinyl acetate copolymers (EVA) which are usually used in solar modules, the α-olefin-vinyl acetate copolymers used according to the invention have advantageous properties, e.g. lower machine-damaging emissions in the production process, excellent ageing resistance, in particular UV resistance, and simplified fixing of the solar cells, as a result of which time and energy savings are achieved in the lamination process. Furthermore, longer operating lives can be achieved when using the α-olefin-vinyl acetate copolymers used according to the invention than when using conventional EVA copolymers.

The present invention further provides for the use of the solar module of the invention for stationary and mobile power generation.

The generation of power usually takes place in a solar power plant which has at least one solar module according to the invention in which the light energy of the sun is converted into electric energy and at least one electrical load.

The present invention therefore further provides a solar power plant containing at least one solar module according to the invention.

Suitable electrical loads are dependent on the type of solar power plant. For example, the load can be a DC load or an AC load. If an AC load is connected, it is necessary to convert the direct current obtained from the solar modules into alternating current by means of a DC-AC converter. It is likewise possible to use solar power plants which contain both DC loads and AC loads.

The solar power plant can also be an island system which does not have a (direct) connection to a power network. The power generated in an island system is usually buffered in accumulators as energy storager (loads for the purposes of the present application). Suitable island systems are known to those skilled in the art.

Furthermore, the solar power plants can be network-coupled plants which are connected to an independent power network and the electric energy is fed into this power network. In this case, the load is thus the power network. Suitable network-coupled plants are likewise known to those skilled in the art.

FIG. 1 shows an example of a preferred solar module according to the invention.

The reference letters in FIG. 1 have the following meanings:

A glass substrate

B transparent polymer layer made up of at least one α-olefin-vinyl acetate copolymer of the type used according to the invention, preferably an ethylene-vinyl acetate copolymer of the type used according to the invention, particularly preferably a Levamelt® ethylene-vinyl acetate copolymer from Lanxess AG;

C solar cells;

D transparent polymer layer made up of at least one α-olefin-vinyl acetate copolymer of the type used according to the invention, preferably an ethylene-vinyl acetate copolymer of the type used according to the invention, preferably a Levamelt® ethylene-vinyl acetate copolymer from Lanxess AG;

E a protective layer;

F frame, preferably an aluminium profile frame;

G seal.

FIG. 1 depicts a preferred embodiment of the solar module of the invention. The invention also encompasses solar modules which do not have components F and G. In particular, the component F can be omitted in the case of flexible solar modules.

Suitable components A, B, C, D, E and F have already been described in detail above. Suitable seals G are known to those skilled in the art.

What is claimed is:

1. A solar module containing at least one layer made up of at least one α-olefin-vinyl acetate copolymer, wherein the α-olefin-vinyl acetate copolymer has a vinyl acetate content of $\geq 60\%$ by weight, based on the total weight of the α-olefin-vinyl acetate copolymer, and has been prepared by a solution polymerization process at a pressure of from 100 to 700 bar.

2. The solar module according to claim 1, wherein the α-olefin-vinyl acetate copolymer has a vinyl acetate content of $\geq 80\%$ by weight, based on the total weight of the α-olefin-vinyl acetate copolymer.

3. The solar module according to claim 1, wherein the α-olefin in the α-olefin-vinyl acetate copolymer is selected from among ethene, propene, butene, pentene, hexene, heptene and octene.

4. The solar module according to any claim 1, wherein the α-olefin-vinyl acetate copolymer has an MFI (g/10 min) measured in accordance with ISO 1133 at 190° C. under a load of 21.1 N of from 1 to 40.

5. The solar module according to claim 1, wherein the α-olefin-vinyl acetate copolymer has an MFI (g/10 min) measured in accordance with ISO 1133 at 190° C. under a load of 21.1 N of from 1 to 10.

6. The solar module according to claim 1, wherein the α-olefin-vinyl acetate copolymer has an MFI (g/10 min) measured in accordance with ISO 1133 at 190° C. under a load of 21.1 N of from 2 to 6.

7. The solar module according to claim 1, wherein the α-olefin-vinyl acetate copolymer has a Mooney viscosity ML 1+4 at 100° C. measured in accordance with DIN 53 523 of from 3 to 50 Mooney units.

8. The solar module according to claim 1, wherein the α-olefin-vinyl acetate copolymer has a Mooney viscosity ML 1+4 at 100° C. measured in accordance with DIN 53 523 of from 4 to 35 Mooney units.

9. The solar module according to claim 1, at wherein the number average molecular weight of the α-olefin-vinyl acetate copolymer determined by means of GPC is from 5000 g/mol to 200 000 g/mol.

10. The solar module according to claim 1, that wherein the α-olefin-vinyl acetate copolymer is present in uncrosslinked form.

11. The solar module according to claim 1, wherein the at least one layer made up of the at least one α-olefin-vinyl acetate copolymer contains no ageing inhibitors and/or no bonding agents.

12. The solar module according to claim 1 which is made up of
   i) a glass substrate A having a front side and a rear side, with the front side being the side facing the sun in the finished solar module;
   ii) a transparent polymer layer B applied to the rear side of the glass substrate;
   iii) one or more solar cells C applied to the polymer layer B;
   iv) a further transparent polymer layer D applied on top of the solar cells;
   v) a protective layer E;
where the solar cells C are embedded in the transparent polymer layers B and D, wherein at least one of the transparent polymer layers B and/or D is/are made up of an α-olefin-vinyl acetate copolymer as defined in any of claims 1 to 5.

13. The solar module according to claim 1 which is made up of
   i) a glass substrate A having a front side and a rear side, with the front side being the side facing the sun in the finished solar module;
   ii) a transparent polymer layer B applied to the rear side of the glass substrate;
   iii) one or more solar cells C applied to the polymer layer B;
   iv) a further transparent polymer layer D applied on top of the solar cells;
   v) a protective layer E;
where the solar cells C are embedded in the transparent polymer layers B and D, wherein both transparent polymer layers B and D are made up of an α-olefin-vinyl acetate copolymer as defined in any of claims 1 to 5.

14. The solar module according to claim 12 or 13, wherein a connection socket and a connection terminal and a frame are additionally present.

15. The solar module according to claim 12 or 13, that wherein a connection socket and a connection terminal and an aluminum profile frame are additionally present.

16. A solar power plant containing at least one solar module according to claim 1.

17. A solar power plant containing at least one solar module according to claim 12.

18. A solar power plant containing at least one solar module according to claim 13.

* * * * *